(12) United States Patent
Reiter et al.

(10) Patent No.: US 12,094,270 B2
(45) Date of Patent: Sep. 17, 2024

(54) IDENTIFICATION OF CORNER CASES OF OPERATING SCENARIOS

(71) Applicant: Robert Bosch GmbH, Stuttgart (DE)

(72) Inventors: Antonia Reiter, Stuttgart (DE); Indrasen Raghupatruni, Hemmingen (DE); Maria Belen Bescos Del Castillo, Moensheim (DE); Paul Ruhnau, Leonberg-Hoefingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 228 days.

(21) Appl. No.: 17/686,031

(22) Filed: Mar. 3, 2022

(65) Prior Publication Data

US 2022/0292894 A1 Sep. 15, 2022

(30) Foreign Application Priority Data

Mar. 10, 2021 (DE) ...................... 10 2021 202 332.0

(51) Int. Cl.
*G07C 5/08* (2006.01)
*G06F 16/901* (2019.01)
*G06F 30/20* (2020.01)
*G07C 5/00* (2006.01)

(52) U.S. Cl.
CPC ....... *G07C 5/0816* (2013.01); *G06F 16/9024* (2019.01); *G06F 30/20* (2020.01); *G07C 5/008* (2013.01); *G07C 5/0841* (2013.01)

(58) Field of Classification Search
CPC ... G07C 5/0808; G06F 30/27; G01C 21/3819; B60W 40/08; H01M 8/04768; G05B 19/41875; G01N 21/94; B60T 11/16; B60T 8/172; G08B 21/06; G06Q 40/02; G06Q 20/065; H04L 41/044; B61L 25/021

See application file for complete search history.

(56) References Cited

U.S. PATENT DOCUMENTS

| 10,773,739 B2 * | 9/2020 | Schaefer-Enkeler ....................... B61L 25/021 |
| 11,418,402 B1 * | 8/2022 | Jakobsson ............. H04L 41/044 |
| 11,700,183 B2 * | 7/2023 | Jakobsson ............ G06Q 20/065 709/224 |
| 2006/0095167 A1 * | 5/2006 | Matsunaga ............. B60T 8/172 701/1 |

(Continued)

OTHER PUBLICATIONS

SAE J3016 Surface Vehicle Recommended Practice, 2018, pp. 1-35.

*Primary Examiner* — Yuri Kan
(74) *Attorney, Agent, or Firm* — NORTON ROSE FULBRIGHT US LLP; Gerard A. Messina

(57) ABSTRACT

A computer-implemented method for identifying corner cases of operating scenarios of vehicles. The method includes receiving one or multiple feature(s) for characterizing an operating state of a vehicle, extracting at least one trace graph relating to the one or to the multiple feature(s) from a graph database, modifying the at least one trace graph, a modified trace graph being generated, reconstructing a first operating scenario from the trace graph, reconstructing a second operating scenario from the modified trace graph, and identifying the second operating scenario as a corner case if the second operating scenario is assessed as new and/or as unknown as compared to the first operating scenario on the basis of a predetermined criterion.

12 Claims, 3 Drawing Sheets

(56) References Cited

U.S. PATENT DOCUMENTS

| | | | |
|---|---|---|---|
| 2009/0106846 A1* | 4/2009 | Dupray | G06Q 40/02 |
| | | | 726/26 |
| 2012/0221171 A1* | 8/2012 | Shirakata | G08B 21/06 |
| | | | 701/1 |
| 2016/0167631 A1* | 6/2016 | Miyazaki | B60T 11/16 |
| | | | 701/70 |
| 2016/0223469 A1* | 8/2016 | Horstmeyer | G01N 21/94 |
| 2019/0204815 A1* | 7/2019 | Ota | G05B 19/41875 |
| 2019/0267650 A1* | 8/2019 | Egawa | H01M 8/04768 |
| 2021/0001866 A1* | 1/2021 | Yoshimura | B60W 40/08 |
| 2023/0013544 A1* | 1/2023 | Schlegel | G07C 5/0808 |
| 2023/0227066 A1* | 7/2023 | Templer | G01C 21/3819 |
| | | | 701/23 |
| 2023/0234576 A1* | 7/2023 | Jung | B60W 30/18163 |
| | | | 701/23 |
| 2023/0376727 A1* | 11/2023 | Kubosawa | G06F 30/27 |

* cited by examiner

IDENTIFICATION OF CORNER CASES OF OPERATING SCENARIOS

BACKGROUND INFORMATION

A corner case may be understood to be a situation in the operation of a technical system, which is in a non-normal and/or uncommon parameter range with respect to the parameters describing the situation. Such parameters may, for example, be operating parameters and/or surroundings variables of the technical system. A corner case (as opposed to an edge case) may be present, in particular, when multiple such parameters are simultaneously non-normal and/or uncommon, even though each is within a specified range. While hypothetical corner cases (in the static) may result even from the specification of parameters—i.e., from their parameter ranges—, the identification of corner cases normally involves ascertaining the corner cases actually occurring during operation (and in the dynamics). Corner cases may, for example, be recognized and/or generated on the basis of known methods such as search-based testing and/or boundary parameter testing.

In the development of a vehicle, in particular, of a vehicle for assisted and/or (semi-)autonomous driving, the situation of a corner case may be understood to mean an operating scenario and/or driving scenario, which is described, for example, via one or multiple time record(s) (for example, velocity, steering angle, etc.) over a certain time period. The respective y-values of the one or of the multiple time record(s) may be viewed as parameters and/or parameters may be derived from these y-values.

In order to achieve a reliable and safe operation of a vehicle, in particular, of a (semi-)autonomous vehicle, methods may be used for verification and validation in the product development cycles. In the process, particular importance is attached to the recognition and testing of corner cases in vehicle test data, in particular, field data.

In the exemplary case of a drive train that includes a duplex clutch and an associated dual slave piston for actuating the duplex clutch, a corner case may, for example, be seen in a high total pressure load of the dual slave piston. Here, for example, each of the two hydraulic chambers of the dual slave piston could be designed for an operating pressure of 40 bar. Since in a conventional drive train (for avoiding a transmission blockage) both clutches of the duplex clutch are not simultaneously (completely) closed, a total pressure load of 80 bar may be assessed as unrealistic. On the other hand, total pressures, for example, in the amount of 60 bar may very well occur at the dual slave piston, for example, during overlapping gear shifts, in which the previously closed clutch of the duplex clutch is open and the previously open clutch is closed. Such total pressures may, for example, be a function of the shift dynamics and/or of the driving mode and may generally be calculated/simulated only with effort beforehand. On the other hand, they may be ascertained simply from field data. In any case, total pressure corner cases may (and should) be taken into consideration in the design (here, for example, in the dimensioning of the wall thicknesses of the dual slave piston).

In the context of the assisted and/or at least semi-autonomous driving, one important class of corner cases may be formed by a (random) combination of surroundings conditions. Here, for example, parameters may be derived from the time records, in particular, from the sensor data from at least one imaging system, in order to define corner cases. For example, parameters for the intensity of the backlight, one or multiple angles of the backlight and a measure of the wet conditions of the roadway may be derived from camera data. In this case, a corner case made up of strong backlight and wet roadway may result in reflections, which result in a false assessment of the driving situation and, in the worst case, in an unsuitable driving maneuver.

SUMMARY

One first general aspect of the present invention relates to a computer-implemented method for identifying corner cases of operating scenarios of vehicles, including receiving one or multiple feature(s) for characterizing an operating state of a vehicle, extracting at least one trace graph relating to the one or to the multiple feature(s) from a graph database, modifying the at least one trace graph, a modified trace graph being generated, reconstructing a first operating scenario from the trace graph, reconstructing a second operating scenario from the modified trace graph, and identifying the second operating scenario as a corner case if the second operating scenario is assessed as new and/or as unknown as compared to the first operating scenario on the basis of a predetermined criterion.

One second general aspect of the present invention relates to a computer program, which is designed for the purpose of carrying out the computer-implemented method according to the first general aspect (or a specific embodiment thereof).

One third general aspect of the present invention relates to a computer-readable medium or signal, which stores and/or contains the computer program according to the second general aspect.

One fourth general aspect of the present invention relates to a computer system, which is provided for the purpose of carrying out the computer program according to the second general aspect.

Corner cases, which may occur during operation and, in particular, during the drive of a vehicle, in particular, of a vehicle for assisted and/or (semi-)autonomous driving, are important (borderline) cases, which may and should be taken into consideration in the design and testing of the vehicle during development and/or during serial production, in order to ensure a reliable and safe operation of the vehicle. Such corner cases may be described over a particular time period via one or multiple time record(s), whose y-values are and/or include parameters (for example, operating parameters and/or surroundings variables such as vehicle velocity, steering angle, sensor data of an imaging system, position data, etc.) and/or from which parameters (for example, intensity and angle of the backlight, a recognized object, etc.) may be derived. The time period may extend from a few interrupts (for example, more than two, more than five, more than ten or more than a hundred) of a control unit (for example, with a 100 Hz clocking) over more than one or over multiple seconds to more than one or multiple minutes and/or to more than one or multiple hour(s) (in some cases, the time period may extend between 10 ms and one hour).

To recognize corner cases, such time records may be detected during the operation and/or during the drive of one or of multiple vehicle(s). In this case, however, usually very large volumes of data are formed, for example, as a function of the data density in the time records and depending on the fleet size, which occupy a large amount of memory space (for example, on a cloud server). Alternatively or in addition, the evaluation of such volumes of data may require lengthy computing time. In cases, in particular, in which the time records are collected not only in test phases during development, but also after the sale and delivery of the vehicles to consumers, in order to be able to continuously improve the functionality (for example, computer vision) via updates, the fleet may include, for example, more than 1e1, more than 1e2, more than 1e3, more than 1e4, more than 1e5, more than 1e6 or more than 1e7 vehicles.

Such volumes of data usually have a high redundancy. On the one hand, these volumes of data describe predominantly normal operating scenarios/driving scenarios, which are frequently already known. In fact, corner cases may be unlikely, in particular, in the case of higher-dimensional parameter spaces. On the other hand, each time record per se or in conjunction with other time records may contain redundant pieces of information (for example, data points in constant phases or proportionalities between signals such as, for example, vehicle velocity and rotational frequency of a drive machine in particular operating states/driving states).

In accordance with an example embodiment of the present invention, using trace graphs, it is possible to store the one or the multiple operating scenario(s)/driving scenario(s) in an aggregated and thus less redundant manner (in some cases in a largely redundancy-free manner). With the aid of reconstruction, for example, with the aid of a simulation, operating scenarios/driving scenarios, which essentially match the original operating scenarios/driving scenarios, may then be generated again from these trace graphs. In this context, the trace graphs may be viewed as a reversible compression. This may reduce the memory required for storing pieces of information relating to operating scenarios and/or driving scenarios.

Such trace graphs may also, for example, (in a two-dimensional plane) be visualized by nodes and edges and thus provide developmental engineers and test engineers an additional perspective of operating scenarios/driving scenarios beyond time records. The nodes may, for example, be represented in a different size and/or in a different color (for example, according to a heat map). In this way, frequency and/or dwell time, for example, may be graphically and thus clearly shown.

The recognition of new and/or unknown operating scenarios/driving scenarios usually requires a comparison of an operating scenario/driving scenario with already existing operating scenarios/driving scenarios. For example, the operating scenario/driving scenario to be assessed may be compared with each of the already existing operating scenarios/driving scenarios, which requires, however, a corresponding computing power due to the large volume of data. An increase in efficiency may, however, be achieved if instead of the operating scenarios/driving scenarios, their associated trace graphs are compared.

In early development phases frequently only a manageable volume of data is present. The knowledge of corner cases for the vehicle to be developed is thus rather limited. In accordance with an example embodiment of the present invention, it may therefore be advantageous to generate new corner cases via modification and, where applicable, to identify them as new corner cases. For this purpose, instead of the operating scenarios/driving scenarios, their trace graphs may be modified. This may prevent a modification from resulting in an operating scenario/driving scenario which, when compared to the original operating scenario/driving scenario, differs only in a redundancy. The method of the first general aspect may thus be viewed as a generic case corner generator based on the aggregate knowledge from field data. In contrast to other corner case generators, which are based (only) on classical verification methods and validation methods (search-based testing, boundary parameter testing), the provided generic corner case generator is a function of a trace graph and is thus, in particular, no longer a direct function of the time record or records (and their data type). One advantage may be seen in the reduction of the possible combinational space, because the trace graph is compressed and (largely) redundancy-free.

The term "vehicle" includes all devices that transport passengers and/or freight. A vehicle may be a motor vehicle (for example, a passenger car or a truck), but also a railroad vehicle. However, floating and flying devices may also be vehicles.

Accordingly, the term "at least semi-autonomously operating vehicle" includes all devices, which transport passengers and/or freight in an at least semi-autonomous manner. An at least semi-autonomously operating vehicle may be a motor vehicle (for example, a passenger car or a truck), but also a railroad vehicle. However, floating and flying devices may also be at least semi-autonomously operating vehicles. The attribute "at least semi-autonomously" conveys that in some situations and/or at least at some times, the vehicle is autonomously controlled (i.e., without the engagement of a user) and/or that certain systems of the vehicle (for example, assistance systems) at least temporarily autonomously assist a driver (for example, an emergency braking system or a lane-keeping assistant). The present description relates, in particular, to assisted and/or to at least semi-autonomous motor vehicles, thus, aspects of the description are accordingly explained below based on examples of at least semi-autonomously operating motor vehicles (including assisted motor vehicles) (for example, autonomous vehicles of the SAE J3016 automation levels 1 through 5). The corresponding aspects are, however, also transferrable to other types of at least semi-autonomously operating vehicles (to the extent they do not relate to specific conditions of at least semi-autonomously operating motor vehicles).

The term "user" includes any person who drives in the vehicle, is transported by the latter or monitors its operation. A user may be a passenger of a vehicle (in particular, a driver). A user may, however, also be situated outside the vehicle and, for example, control and/or monitor the latter (for example, during a parking process or from a remote center).

An "operating scenario" may be any scenario that occurs during the operation of the vehicle. For example, an operating scenario may be a particular driving situation. An operating scenario may refer to a temporally limited phase of the operation of the vehicle (for example, shorter than 10 minutes or shorter than 1 minute). An operating scenario in this case is not limited to scenarios, in which the vehicle is moving (i.e., is driving).

The term "driving scenario" is understood to mean an operating scenario that occurs during the drive of the vehicle.

The term "sensor data" includes all data that are detected for the vehicle during the operation of the vehicle. The sensor data in this case may be detected by sensors of the vehicle. Sensor data may also be detected outside the vehicle (and transmitted to the latter). For example, GPS data (or other position data) are sensor data. The term "sensor data" also includes processing stages of the data, which are recorded by the respective sensors, as well as corresponding metadata. Further examples are found below.

"Field data" include all data that accrue in conjunction with the operation of a vehicle (or of a plurality) of vehicles, and which are used, for example, for designing (for example, training) at least semi-autonomous vehicles. For example, field data may be used to generate corresponding operating scenarios in simulation surroundings for training at least semi-autonomous vehicles (or the systems contained therein).

DETAILED DESCRIPTION OF EXAMPLE EMBODIMENTS

The methods presented in this description are aimed at generating and identifying corner cases 40 of operating scenarios/driving scenarios, which may be of significance during the development and/or testing of a vehicle, in particular, of the (semi-)autonomous driving of a vehicle.

Figure 1:
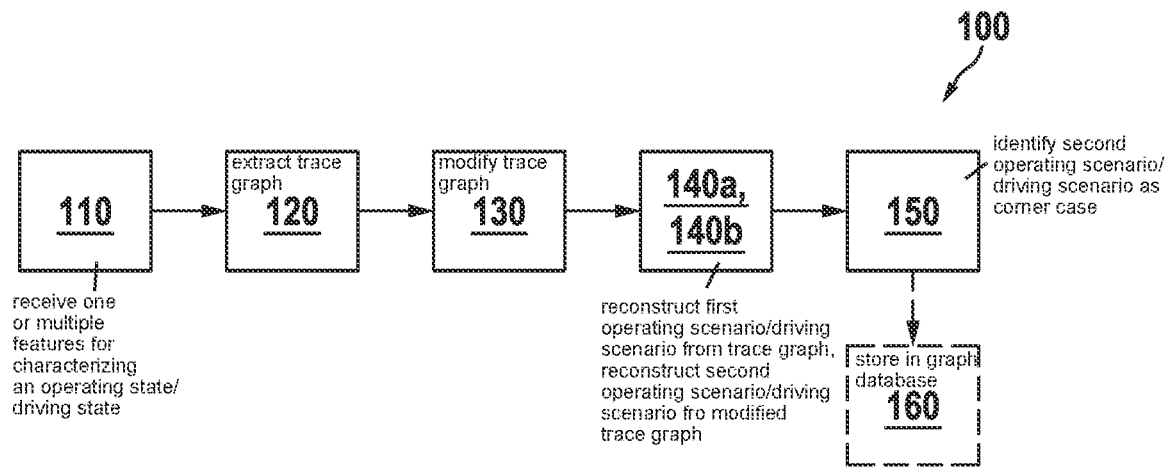
FIG. 1 is a flowchart, which schematically illustrates the methods of example embodiments of the present invention.
Figure 3:
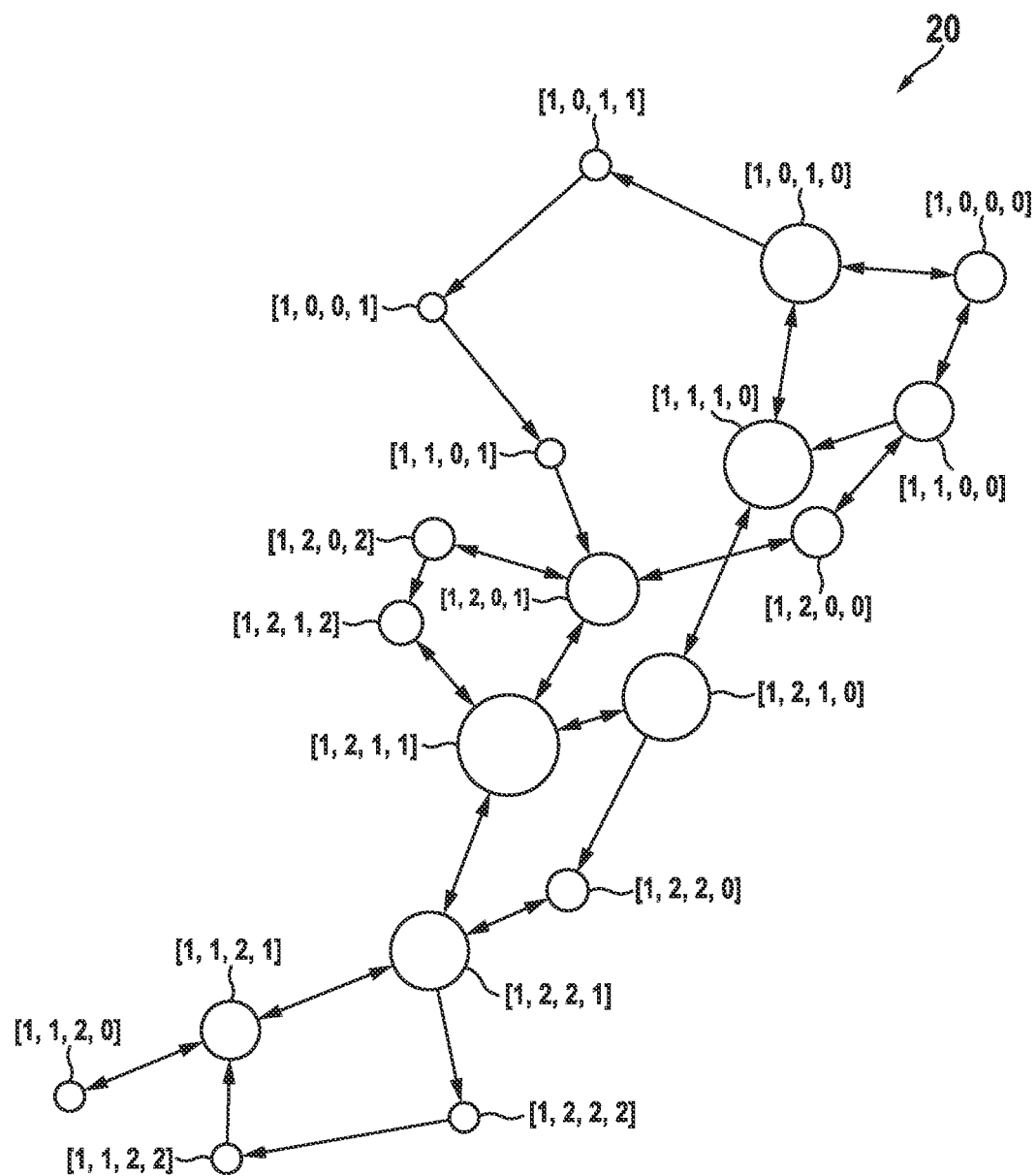
FIG. 3 shows an example of a trace graph.

A computer-implemented method 100 is provided for identifying corner cases 40 of operating scenarios/driving scenarios of vehicles, which is schematically represented in FIG. 1. Method 100 includes receiving 110 one or multiple feature(s) 10 for characterizing an operating state/driving state. Method 100 further includes extracting 120 at least one trace graph 20 relating to the one or to the multiple feature(s) 10 from a graph database 500. Graph database 500 may be a database or may be implemented by an equivalent memory structure. Reception 110 of the one or of the multiple feature(s) 10 for characterizing an operating state/driving state may also implicitly take place (i.e., may be formally omitted), in that a trace graph 20 is selected/extracted from graph database 500. In fact, the selection of trace graph 20 already implicitly includes a choice of the one or of the multiple feature(s) 10, since each node in trace graph 20 corresponds to a respective value range in one and the same (vector) space spanned by feature or features 10. In other words, each trace graph 20 may be assigned to one or to multiple feature(s) 10. FIG. 3 shows, for example, a trace graph 20 including four features 10, each node being assigned a four-dimensional vector (for example, [1, 2, 1, 1], whose entries refer to the basis in a vector space defined by feature or features 10 (in other cases, each node may be assigned a vector of a higher or lower dimensionality, for example, including four dimensions or fewer than four dimensions).

Method 100 further includes modifying 130 the at least one trace graph 20, a modified trace graph 21 being generated. The modification 130 of the at least one trace graph 20 may, for example, include a change (for example, a deformation, i.e., a continuous change) of the nodes and/or of the edges of trace graph 20, as well as of all parameters (frequency, dwell time, directions, etc.), which are assigned to the nodes or to the edges. The vectors of one node or of multiple nodes, in particular, (for example, within the corresponding specification) may be changed in the (vector) space spanned by feature or features 10. In the exemplary case, in which a feature corresponds to the vehicle velocity of the vehicle, the entry of this feature into a higher or lower vehicle velocity range may, for example, be scaled.

One further option for modifying 130 may be to remove one or multiple node(s) and their associated edges. Alternatively or in addition, one or multiple node(s) may be added, and may be connected via new edges to the originally existing nodes. By removing nodes and/or edges, it is possible to eliminate states and/or transitions between states. Alternatively or in addition, states and/or transitions between states may be generated by adding nodes and/or edges.

The modification 130 of trace graph 20 may, for example, aim at closing gaps of operating scenarios/driving scenarios in the measured data (for example, in the field data).

Method 100 further includes reconstructing 140a a first operating scenario/driving scenario 30 from trace graph 20 and reconstructing 140b a second operating scenario/driving scenario 31 from modified trace graph 21, the order of reconstruction 140a of first operating scenario/driving scenario 30 and of reconstruction 140b of second operating scenario/driving scenario 31 being irrelevant. Reconstruction 140a and reconstruction 140b may include selecting one trace each in the trace graph, from which in each case (first/second) operating scenario/driving scenario 30, 31 may be reconstructed. The selection of the trace may take place automatically and/or manually. An automatic selection may, for example, be implemented by selecting an arbitrary node as a start node and starting from which in the direction of the arrow of an edge, one further arbitrary node is selected. This process may be repeated until a trace of a desired length (number of nodes in a trace) is achieved. Depending on the trace graph, however, it may also happen that the desired length of the trace is not able to be achieved. In this case, either a shorter length of the trace may be accepted or a new attempt may be started using another start node. Trace 11 may be a sequence of two or more nodes of trace graph 10, two consecutive nodes each of the sequence having an arrow direction in the direction of the sequence. This sequence may also repeatedly contain one or multiple nodes of trace graph 10. A graphic representation of the trace in this case then includes one or multiple closed loop(s).

It may be advantageous to select a trace prior to modification 130 of trace graph 20 and when modifying 130 trace graph 20, to also modify the trace. This may increase the comparability of reconstructed operating scenarios/driving scenarios 30, 31.

Reconstruction 140a, 140b may include a simulation of first or second operating scenarios/driving scenarios 30, 31. Reconstruction 140a, 140b of first or second operating scenario/driving scenario 30, 31 may further include checking whether first or second operating scenario/driving scenario 30, 31 is realistic. Such a check may, for example, be whether first or second operating scenario/driving scenario 30, 31 is able to be (successfully) simulated. Negotiating a curve at an up-scaled vehicle velocity may, for example, encounter physical limits if the lateral dynamics are simulated simultaneously. In other words, the solvability of the model equations may be seen as a measure of the reconstructed operating scenario/driving scenario being realistic. Alternatively or in addition, a vehicle specification may also be used in assessing the realisticity such as, for example, how fast a curve having a particular curve radius must be able to be negotiated. The term "reconstruct" is aimed on the one hand at generating an operating scenario/driving scenario 30, 31 on the basis of a trace graph 20, which has been originally derived from a measurement. Alternatively or in addition, "reconstruct" may also be understood in the sense of "construct," i.e., independently of a derivation of trace graph 20 from a measurement. This may, for example, be the case if the trace graph itself has been synthetically generated or changed (such as, for example, modified trace graph 21) and has been stored in graph database 500 (for example, in step 160). Alternatively or in addition, the trace graph may also stem from vehicle measurements of another project (typically of a predecessor project).

Method 100 further includes identifying 150 second operating scenario/driving scenario 31 as corner case 40, if second operating scenario/driving scenario 31 is assessed as new and/or as unknown as compared to first operating scenario/driving scenario 30 on the basis of a predetermined criterion.

Identification 150 of second operating scenario/driving scenario 31 as new and/or as unknown aims at, among other things, keeping the set of trace graphs 20, 21, which may be, for example, stored 160 in graph database 500, as small and redundancy-free as possible. This may result in method 100 remaining efficient even after many repetitions. Additional embodiments relating to possible forms of the predetermined criterion are found further below.

One (for example, each, in particular, first and/or second) operating scenario/driving scenario 30, 31 may include one or multiple time record(s). The one or the multiple time record(s) may be one or multiple sensor data, optionally one or multiple sensor data of an at least semi-autonomously driving vehicle. The multiple time records may relate to one and the same time period. The scans of the multiple time records may be different. The one or the multiple time record(s) may be field data.

Figure 4:
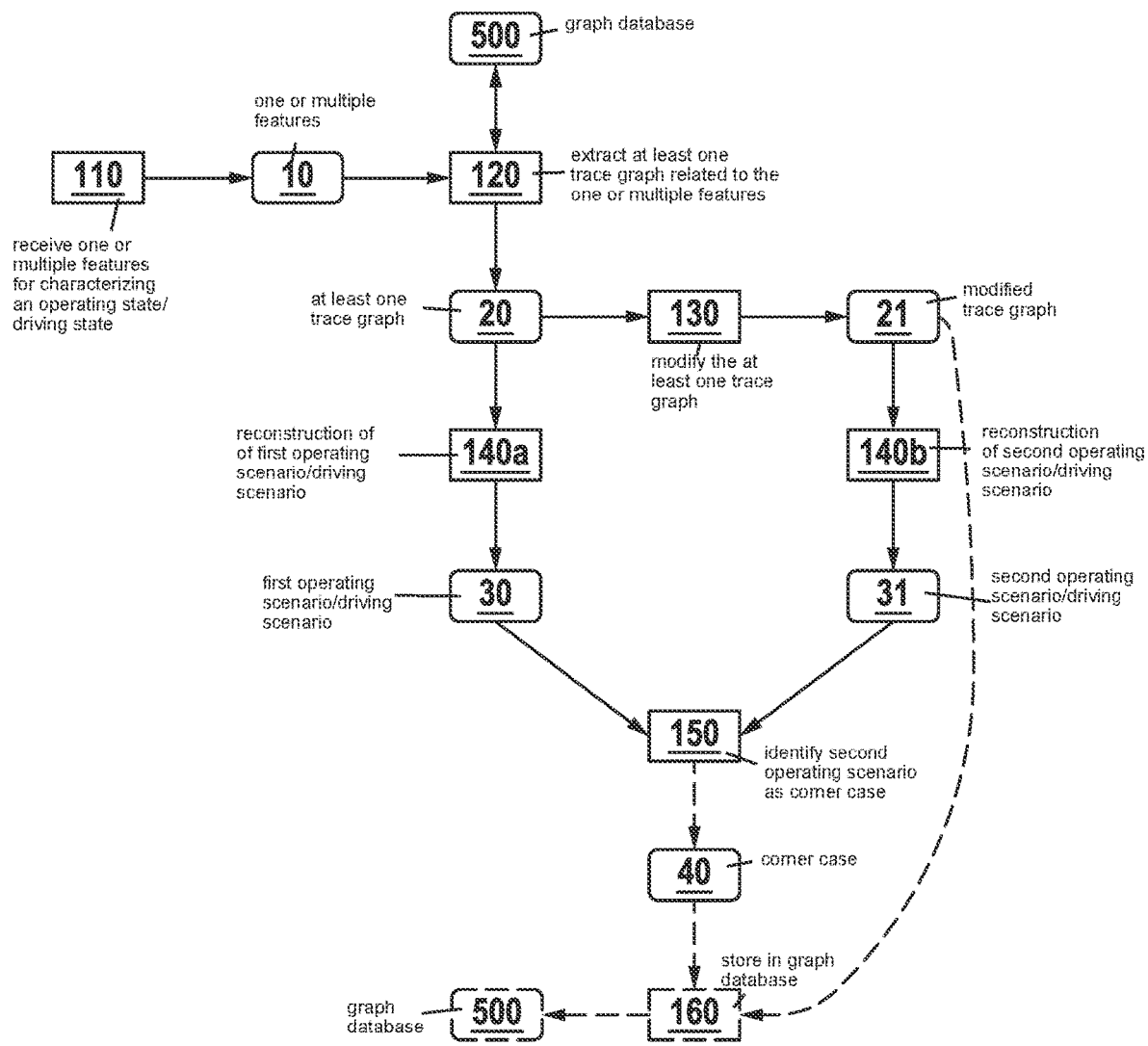
FIG. 4 shows one specific embodiment of a flowchart, which schematically illustrates the methods of example embodiments of the present description.

FIG. 4 shows one specific embodiment of method 100 for identifying corner cases 40 of operating scenarios/driving scenarios.

A (for example, arbitrary) feature 10 for characterizing an operating state/driving state may include (or be) a time record and/or a value range (or a part of the value range, in particular, one value) of the time record. Alternatively or in addition, a (for example, arbitrary) feature 10 may also include (or be) a parameter of the one or of the multiple time record(s) or a parameter derived from the latter. In the exemplary case including four features 10, one node, for example, being assigned the four-dimensional vector [1, 2, 1, 1], the first entry (here: a 1) of the vector may, for example, be assigned to a value range of the vehicle velocity of 20 km/h to 50 km/h. Furthermore, the second entry (here: a 2) of the vector may, for example, be assigned to a value range of the steering angle of 0° to +5°. Furthermore, the third entry (here: a 1) of the vector may, for example, be assigned to an intensity of the backlight derived from the camera data of 3 (or of a value range, for example on a unitless scale of 1 through 5). Furthermore, the fourth entry (here: a 1) of the vector may, for example, be assigned to a (discrete) classification result for recognizing an obstacle on the roadway. Each possible other node of trace graph 20, 21 may also include a four-dimensional vector (for example, [2, 0, 1, 1]) with other entries in each case. In this case the entries of two vectors may be viewed as different if they differ in at least one entry. The vectors of the nodes of a trace graph may, however, relate to the same features. For example, the first entry (here: a 2) of the vector of the other node may also relate to the time record vehicle velocity and, in particular, to a value range of the vehicle velocity, for example, of 50 km/h to 70 km/h, etc.

A trace graph 20, 21, represented, for example, in FIG. 3, may be a graph. The graph may include one or multiple node(s), each node corresponding to a value range in a (vector) space spanned by feature or features 10. The value ranges of two nodes each of trace graph 20, 21 may be different. Overlaps between value ranges of two nodes each of trace graph 20, 21 may be avoided. Each value range may be a higher-dimensional subset of the (vector) space spanned by feature or features 10. One node may correspond to a value range in the (vector) space in that the node is assigned a vector, whose entries are coordinates relating to a basis in the (vector) space and/or to enumeration of subsets of the (vector) space. For example, (higher-dimensional) intervals in the (vector) space may be numbered consecutively.

In particular cases, it may be advantageous if the trace graph repeatedly includes at least one node. Such a node could, for example, represent an intermediate state, which occurs in two operating scenarios/driving scenarios each of which, however, should be kept apart.

The graph may further include no edge or one edge between two nodes each, each edge having at least one arrow direction, optionally also being capable of having opposite arrow directions, the arrow direction in each case indicating the direction of a transition between the value ranges associated with the nodes.

Each node may be assigned a frequency, which may optionally be represented by the size of the node. Alternatively or in addition, each node may be assigned a dwell time, which may be optionally represented by a color coding. Alternatively or in addition, each edge (or each edge and its direction) may be assigned a transition frequency, which may be optionally represented by a further color coding (for example, the arrow tips of edges may be correspondingly colored in each case).

The at least one trace graph 20, 21 may be a data structure, which represents one or multiple time record(s) in an aggregated and compressed (i.e., largely redundancy-free) manner. The one or the multiple time record(s) may be, in particular, sensor signals of the vehicle or of the vehicles of the vehicle fleet. The data structure may, for example, be stored in an xml or json format. In this case, metadata (for example, for uniquely identifying vehicles in the vehicle fleet) may also be stored.

Modification 130 of the at least one trace graph 20 may be based on a parameter description model. In the parameter description model, pieces of information (for example, parameters, intervals, boundary conditions) may be included, which provide information about the extent to which trace graph 20 may/can be modified. This may, for example, prevent an operating scenario/driving scenario (for example, an acceleration to a high vehicle velocity within a very short period of time) from being required of a vehicle, although the operating scenario/driving scenario is outside the specification of the vehicle. In addition or alternatively, modification 130 of the at least one trace graph 20 may be based on a parameter noise description model. The parameter noise description model may include pieces of information (for example, further parameters, intervals, boundary conditions, distribution functions, etc.), on the basis of which trace graph 20, in particular a node or an edge of trace graph 20, may be subject to noise. For example, a dwell time assigned to a node may be determined ("cubed") according to a distribution function.

In one exemplary specific embodiment of the present invention, a trace graph 20 may (or multiple trace graphs 20 may) be generated using Monte Carlo simulation including the following exemplary noise parameters. On the one hand, a dwell time per node may be calculated according to a distribution function of the dwell time per node. Furthermore, node transitions across existing edges may be calculated according to a distribution function of the state transitions of two nodes each.

Furthermore, parameters of the individual clusters/nodes may be calculated with start values, for example, by sampling via a continuous-time stochastic process (for example, Wiener process, Ornstein-Uhlenstein process). The start values may represent, for example, limiting values of the individual clusters/nodes. Alternatively or in addition, the start values may be parameter values according to the logic of an inverse Gaussian distribution of the known parameter distribution within a cluster/node with low occurrence probability. For example, those start values may be used, which had a low probability when the graph was generated—either by using the inverse Gaussian distribution or by reading out from tables, for example, values outside of a 1-sigma or 2-sigma probability range. Alternatively or in addition, the start values may also be parameter values according to the logic of a randomized Gaussian distribution. Nodes according to the parameter description model may furthermore be added via a Gaussian distribution (addition, for example, outside a 2-sigma range). Edges according to the parameter description model may furthermore be added via a Gaussian distribution (addition, for example, outside a 2-sigma range).

In one other exemplary specific embodiment (or in addition), a trace graph 20 may (or multiple trace graphs 20 may) be generated by a generative adversarial network (GAN) or GraphGAN.

Modification 130 of the at least one trace graph 20 may be based on search-based testing and/or on boundary case testing. The use of search-based testing and/or boundary case testing may be advantageous, since the realm of possibilities in the modification 130 of the at least one trace graph 20 may be very large (and infinitely large without discretization). Due to search-based testing and/or to boundary case testing, few (and thereby manageable) configurations within the large realm of possibilities are able to be determined, which cover the large realm as well as possible. This may also prevent multiple modifications of the at least one trace graph 20 from being too similar. As a result, time and resources may be saved when identifying corner cases.

Modified trace graph 21 may, for example, be generated via the parameter description model and/or via a generator, which generates the extracted trace graph according to classical verification methods (search-based testing, boundary parameter testing).

Reconstruction 140a, 140b of an operating scenario/driving scenario 30, 31 from a trace graph 20, 21 may generate an operating scenario/driving scenario 30, 31, in particular, simulative time records associated with feature or features 10, in such a way that a further trace graph may be derived (or generated) from generated operating scenario/driving scenario 30, 31, which is equivalent to trace graph 20, 21 (according to one further predetermined criterion). In this respect, the trace graph may be viewed as a reversible compression.

The derivation (or generation) of a trace graph for one or for multiple time record(s) from an operating scenario/driving scenario may initially include clusters of y-values of the one or of the multiple time record(s) in at least two clusters in a (vector) space, whose dimensionality corresponds to the number of the one or of the multiple time record(s), optionally with the aid of unsupervised learning. In this case, unsupervised machine learning may optionally be used (for example, k-means clustering or other cluster methods).

For example, the y-values of two time records (for example, vehicle velocity and steering angle) (as point clouds) may be mapped into a two-dimensional (vector) space and two-dimensional clusters, i.e., two-dimensional subsets may be defined in the two-dimensional (vector) space.

Alternatively, the generation of the trace graph for the one or the multiple time record(s) (or in addition the clustering of y-values of the one or of the multiple time record(s) in at least two clusters in the (vector) space) may initially include clustering of y-values of each of the time records separately into respectively one-dimensional clusters, at least for one time record at least two one-dimensional clusters being capable of being defined. In the case of multiple time records, the generation of the trace graph (or the clustering of y-values of the one or of the multiple time record(s) into at least two clusters in the (vector) space may then include the creation of higher-dimensional clusters in a (vector) space, whose dimensionality corresponds to the number of the multiple time records, by combining one-dimensional clusters per time record. If, for example, the y-values of the time record (for example, of the vehicle velocity) are clustered into two clusters and the y-values of the time record (for example, of the steering velocity) are clustered into three clusters, six high-dimensional (here: two-dimensional) clusters in the (vector) space are defined.

The derivation of the trace graph may furthermore include identifying at least one cluster (for example, a higher-dimensional value range) as a node in the trace graph. In general, at least two clusters are identified as nodes, since otherwise the trace graph may include no edge and thus no transition between states. The creation of nodes in the trace graph may include a state-to-vector transformation with respect to the one or to the multiple feature(s). The derivation of the trace graph may furthermore include analyzing the transitions between clusters based on the one or on the multiple time record(s), and identifying at least one transition as the edge between two nodes in the trace graph. The derivation of the trace graph may optionally also include evaluating the frequency of a cluster and/or of the dwell time of a cluster based on the one or on the multiple time record(s).

The derivation of the trace graph may optionally also include adding the frequency of a cluster and/or of the dwell time of a cluster to the node in the trace graph identified with the cluster. The cluster formation may be designed in such a way that in the course of the cluster formation, irrelevant and/or redundant information in the one or in the multiple time record(s) is eliminated.

The further predefined criterion is designed for the purpose of being able to compare two trace graphs. For this purpose, the number of the nodes in the two trace graphs, for example, may be initially compared. Alternatively or in addition, the number of the edges in the two trace graphs may be compared. Furthermore, the number of the matching nodes in the two trace graphs, for example, may be ascertained. Alternatively or in addition, the number of the matching edges between matching nodes in the two trace graphs may also be ascertained. Alternatively or in addition, the parameters assigned to the nodes and/or to the edges may be compared with one another. In this case, it may be advantageous to situate the nodes, for example, ordered according to their vector. In this way, it is possible, for example, to also identify two non-matching but closely situated nodes each from both trace graphs. Alternatively or in addition, the trace graphs may be embedded in a (metric) space. In this way, it is possible using a metric to ascertain a distance between the trace graphs. In this case, known distance measures, for example, the Levenshtein-distance (for example, after transformation of the trace graph into one character string each), the Hamming distance, average shortest paths and/or Euclidean surfaces, may be applied.

The predetermined criterion (for assessing the novelty and/or unfamiliarity of second operating scenario/driving scenario 31) may be based on comparing the time record or the time records of first operating scenario/driving scenario 30 with the time record or time records of second operating scenario/driving scenario 31. For such a comparison, the time records (for example, the vehicle velocities) for one feature 10 each of the first or the second operating scenario/driving scenario may be compared. Known methods for comparing two curves may be used in this case. In cases in which the time period of the time records is identical, an integral may, for example, be calculated, via the absolute difference between a time record of first operating scenario/driving scenario 30 and of the associated time record of second operating scenario/driving scenario 31. Such an integral may then be viewed as a measure of the dissimilarity of these time records. Furthermore, one predefined threshold value each may be defined, above which the dissimilarity is assessed as new and/or as unknown.

In the case of multiple time records per operating scenario/driving scenario, it is possible to calculate a total measure of the dissimilarity of the operating scenarios/driving scenarios (for example, via summation and/or mean value formation) from the measures of the dissimilarity and/or from the assessments of these time records with respect to novelty and/or unfamiliarity. In this way, it is then possible to ascertain an overall assessment with respect to novelty and/or unfamiliarity of second operating scenario/driving scenario 31, if necessary, again via a comparison of the total measure with a predetermined threshold value.

Modified trace graph 21 may be stored 160 in graph database 500 if second operating scenario/driving scenario 31 has been identified as corner case 40. As a result, the set of trace graphs, which (now) correspond to known corner cases 40, is expanded in graph database 500. Storing 160 the (modified) trace graph instead of the (second) operating scenario/driving scenario may be advantageous, insofar as the data size of the trace graph is significantly smaller as compared to the operating scenario/driving scenario (for example, with one or with multiple time record(s)). As a result, more operating scenarios/driving scenarios than trace graphs may be stored with the same memory space. Furthermore, this may be viewed as a prerequisite for method 100 being able to be repeated multiple times and still remain efficient.

Method 100 may be carried out in a control unit in a vehicle, graph database 500 being capable of being stored within the vehicle or on a cloud server. Within the vehicle, graphic database 500 may, for example, be stored in a non-volatile memory of a control unit. Alternatively, graph database 500 may also be stored in a volatile memory of the control unit if a later data transfer, for example into a cloud server, is intended. One advantage of method 100 in the control unit of the vehicle may be seen in that large volumes of data, in particular redundant data, may be discarded before they are finally stored (for example, in the form of trace graphs).

A computer program 200 is described, which is designed for the purpose of carrying out computer-implemented method 100 for identifying corner cases 40 of operating scenarios/driving scenarios. Computer program 200 may, for example, be present in an interpretable or in a compiled form. It may be loaded for the purpose of implementation, for example, as a byte sequence into the RAM of a control unit or computer.

A computer-readable medium or signal 300, which stores and/or contains computer program 200, is further described. The medium may, for example, include one of RAM, ROM, EPROM, etc., in which the signal is stored.

Figure 2:
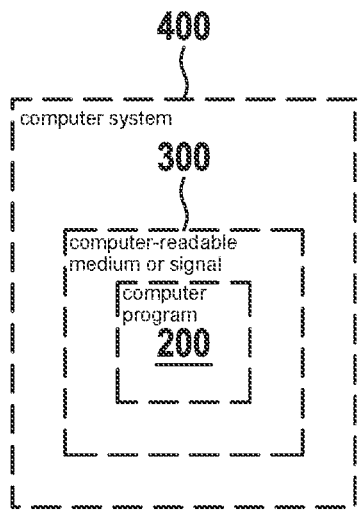
FIG. 2 schematically shows a computer program, a computer-readable medium or signal and a computer system, in accordance with an example embodiment of the present invention.

A computer system 400 is further described, represented schematically in FIG. 2, which is designed for the purpose of carrying out computer program 200. Computer system 400 may include, in particular, at least one processor and at least one working memory. Computer system 400 may further include a memory including graph database 500. Alternatively or in addition, computer system 400 may include a communication interface, via which a link to graph database 500 may be established.

What is claimed is:

1. A computer-implemented method for identifying corner cases of operating scenarios of vehicles, comprising:
   generating one or more time records of sensor data from one or more sensors of a vehicle during at least semi-autonomous operation of the vehicle;
   determining one or multiple features for characterizing an operating state of a vehicle based on the one or more time records of sensor data from the one or more sensors of the vehicle;
   extracting at least one trace graph relating to the one or to the multiple features from a graph database;
   modifying the at least one trace graph, a modified trace graph being generated;
   reconstructing a first operating scenario from the trace graph;
   reconstructing a second operating scenario from the modified trace graph;
   identifying the second operating scenario as a corner case based on the second operating scenario being assessed as new and/or as unknown as compared to the first operating scenario on the basis of a predetermined criterion; and
   testing the corner case during the at least semi-autonomous operation of the vehicle.

2. The method as recited in claim 1, wherein the first and second operating scenarios each includes one or multiple time records.

3. The method as recited in claim 2, wherein the one or the multiple time records are one or multiple sensor data.

4. The method as recited in claim 3, wherein the one or multiple sensor data are one or multiple sensor data of a vehicle.

5. The method as recited in claim 1, wherein each of the features for characterizing the operating state includes a record and/or a value range of a time record.

6. The method as recited in claim 1, wherein each of the at least one trace graphs is a graph, including:
   one or multiple nodes, each node corresponding to a value range in a space spanned by the feature or the features;
   no edge or one edge between two nodes each, each edge having at least one arrow direction, the arrow direction in each case indicating a direction of a transition between the value ranges associated with the two nodes.

7. The method as recited in claim 1, wherein the reconstruction of the first and second operating scenario from the trace graph and modified trace graph, respectively, generates the first and second operating scenarios, respectively, including simulative time records associated with the one or more features, in such a way that a further trace graph may be derived from each of the generated first and second operating scenarios, which is equivalent to the trace graph and the modified trace graph.

8. The method as recited in claim 2, wherein the predetermined criterion is based on comparing the one or multiple time records of the first operating scenario with the one or multiple time records of the second operating scenario.

9. The method as recited in claim 1, wherein the modified trace graph is stored in the graph database when the second operating scenario is identified as a corner case.

10. The method as recited in claim 1, wherein the steps of the method are carried out in a control unit in a vehicle, the graph database being stored within the vehicle or on a cloud server.

11. A non-transitory computer-readable medium on which is stored a computer program for identifying corner cases of operating scenarios of vehicles, the computer program, when executed by a computer, causing the computer to perform the following steps:
- generating one or more time records of sensor data from one or more sensors of a vehicle during at least semi-autonomous operation of the vehicle;
- determining one or multiple features for characterizing an operating state of a vehicle based on the one or more time records of sensor data from the one or more sensors of the vehicle;
- extracting at least one trace graph relating to the one or to the multiple features from a graph database;
- modifying the at least one trace graph, a modified trace graph being generated;
- reconstructing a first operating scenario from the trace graph;
- reconstructing a second operating scenario from the modified trace graph;
- identifying the second operating scenario as a corner case based on the second operating scenario being assessed as new and/or as unknown as compared to the first operating scenario on the basis of a predetermined criterion; and
- testing the corner case during the at least semi-autonomous operation of the vehicle.

12. A computer system configured to identify corner cases of operating scenarios of vehicles, the computer system configured to:
- generate one or more time records of sensor data from one or more sensors of a vehicle during at least semi-autonomous operation of the vehicle;
- determine one or multiple features for characterizing an operating state of a vehicle based on the one or more time records of sensor data from the one or more sensors of the vehicle;
- extract at least one trace graph relating to the one or to the multiple features from a graph database;
- modify the at least one trace graph, a modified trace graph being generated;
- reconstruct a first operating scenario from the trace graph;
- reconstruct a second operating scenario from the modified trace graph;
- identify the second operating scenario as a corner case based on the second operating scenario being assessed as new and/or as unknown as compared to the first operating scenario on the basis of a predetermined criterion; and
- test the corner case during the at least semi-autonomous operation of the vehicle.

\* \* \* \* \*